United States Patent
Lin

[19]

[11] Patent Number: 6,162,679
[45] Date of Patent: Dec. 19, 2000

[54] METHOD OF MANUFACTURING DRAM CAPACITOR

[75] Inventor: Chingfu Lin, Taipei, Taiwan

[73] Assignee: Worldwide Semiconductor Manufacturing Corp., Hsinchu, Taiwan

[21] Appl. No.: 09/306,261

[22] Filed: May 6, 1999

[30] Foreign Application Priority Data

Apr. 26, 1999 [TW] Taiwan .................................. 88106623

[51] Int. Cl.⁷ .............................................. H01L 21/8242
[52] U.S. Cl. ........................................... 438/253; 438/725
[58] Field of Search .................................. 438/253–256, 438/393–399, 725

[56] References Cited

U.S. PATENT DOCUMENTS 5,966,611  10/1999  Jost et al. ................................. 438/397

Primary Examiner—Jey Tsai
Attorney, Agent, or Firm—J. C. Patents; Jiawei Huang

[57] ABSTRACT

A method of forming trench type DRAM capacitor. An insulation layer is formed on a substrate with a trench exposing a conductive region of the substrate. A first conductive layer is formed and conformal to a surface profile of the substrate. A photoresist layer is formed over the first conductive layer to fill the trench. A three-stage of etching process is carried out. A first stage of etching step is carried out to remove a portion of the photoresist layer, thereby exposing the first conductive layer. A second stage step is carried out to remove the first conductive layer by performing an isotropic dry etching step. The first conductive layer is slightly over-etched so that a portion of the first conductive layer inside the trench is also removed. Therefore, the first conductive layer inside the trench will be at a distance lower than a top surface of the insulation layer. A third stage of etching operation is carried out to remove the remaining photoresist layer so that the remaining first conductive layer inside the trench is exposed. A dielectric layer and a second conductive layer are sequentially formed over the first conductive layer.

20 Claims, 2 Drawing Sheets

METHOD OF MANUFACTURING DRAM CAPACITOR

CROSS-REFERENCE TO RELATED APPLICATION

This application claims the priority benefit of Taiwan application serial no. 88106623, filed Apr. 26, 1999, the full disclosure of which is incorporated herein by reference.

BACKGROUND OF THE INVENTION

1. Field of Invention

The present invention relates to a method of manufacturing a dynamic random access memory (DRAM). More particularly, the present invention relates to a method of manufacturing trench type DRAM capacitor.

2. Description of Related Art

Trench DRAM capacitor is a widely used type of capacitor in association with other semiconductor devices. As soon as a trench is formed in an insulation layer above a substrate, polysilicon material is deposited into the trench to form a polysilicon layer that serves as the lower electrode of the capacitor. To prevent possible connection with a neighboring capacitor, chemical-mechanical polishing operation is conducted to remove the polysilicon material outside the trench area. In general, a layer of insulation material having a thickness of about 1500 Å to 2000 Å is removed in the polishing operation so that the independence of circuit between neighboring capacitors is ensured. In practice a thickness as high as 4000 Å may be removed, and hence the degree of planarity for the entire substrate structure may be affected. While several chemical-mechanical steps are performed in DRAM fabrication, global thickness differences may be cause, and this has impact on high aspect ratio etching. furthermore, it is difficult to control the capacitor at a pre-defined height level, and so there is much variation in the capacitance of each capacitor.

SUMMARY OF THE INVENTION

Accordingly, the present invention is to provide a method of forming a trench type DRAM capacitor capable of simplifying processing operation and reducing cost. Moreover, the method can produce a capacitor with smaller leakage current, more standard vertical dimensions and less chance of connection with neighboring capacitors.

To achieve these and other advantages and in accordance with the purpose of the invention, as embodied and broadly described herein, the invention provides a method of forming trench type DRAM capacitor. An insulation layer is formed over a substrate, and a trench is formed in the insulation layer. The trench has a depth roughly equal to the overall height of the capacitor. A first conductive layer conformal to the trench interior is formed over the insulation layer. A photoresist layer is formed over the first conductive layer. A three-stage of etching operation is carried out to pattern the first conductive layer. A first stage of etching operation is carried out to remove a portion of the photoresist layer outside the trench region, thereby exposing the underlying first conductive layer. A second stage operation is carried out to remove the first conductive layer outside the trench region by performing an isotropic dry etching operation. The first conductive layer is slightly over-etched so that a portion of the first conductive layer inside the trench is also removed. Hence, the upper surface of the first conductive layer inside the trench will be at a distance below the upper surface of the insulation layer. A third stage of etching operation is carried out to remove the remaining photoresist layer until the remaining first conductive layer inside the trench is exposed. A dielectric layer and a second conductive layer are sequentially formed over the first conductive layer such that the first conductive layer, the dielectric layer and the second conductive layer together form a capacitor.

According to the embodiment of this invention, the first, second and third stage of etching operations can be carried out inside the same etching station. Furthermore, the first stage of etching operation can be subdivided into a rapid photoresist etching operation and a slow photoresist etching operation. In the rapid photoresist etching operation, an etchant containing oxygen is used. In the slow photoresist etching operation, an etchant containing oxygen and gaseous halogens is used. The flow rate of oxygen over gaseous halogens can be smaller than 10, and preferably between 4 to 8. In the second stage of etching operation, isotropic dry etching operation can be used with the etchant containing oxygen and gaseous halogens. The flow rate of oxygen over halogens is preferably below 2.

Since all three etching operations of this invention use an etchant that contains various combinations of oxygen and halogens, the same etching station can be used. Hence, the etching process is simplified and the cost of production is lowered. In addition, isotropic dry etching operation generally has a high etching selectivity between the first conductive layer and the photoresist layer. Therefore, the first conductive layer can be over-etched a little so that no residual conductive material will remain above the insulation layer for electrical connection with a neighboring capacitor. Furthermore, the dry etching operation is able to increase the planarity of the first conductive layer. Hence, the capacitor will have a smaller leakage current. The capacitor so formed will have close to standard dimensions.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
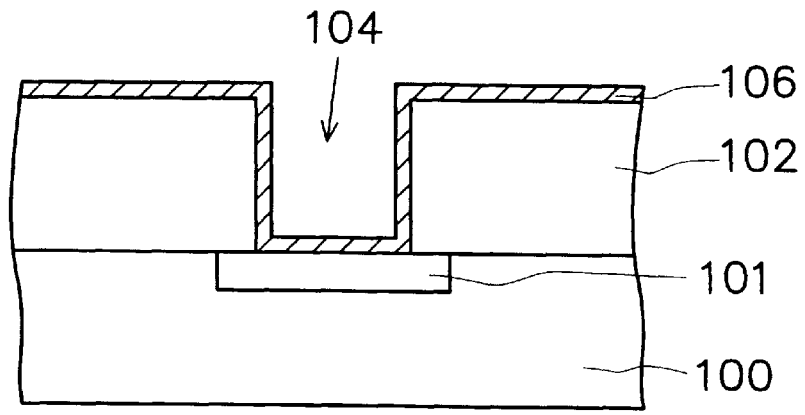
FIGS. 1A through 1F are cross-sectional views showing the progression of steps in producing a DRAM capacitor according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are cross-sectional views showing the progression of steps in producing a DRAM capacitor according to one preferred embodiment of this invention.

As shown in FIG. 1A, a substrate 100 such as a semiconductor silicon substrate is provided. The substrate 100 may already contain some semiconductor elements (not shown) such as MOS transistors, word lines and bit lines and a conductive region 101. An insulation layer 102 is formed over the substrate 100, and a trench 104 is formed in the insulation layer 102 for fabricating a capacitor. Typically, the trench 104 exposes at least a part of the conductive region 110 and has a depth roughly equal to an overall height of the capacitor to be formed. A conductive layer 106 such as a doped polysilicon layer is formed on the insulation layer 102. The conductive layer 106 is conformal to the outline of the insulation layer 102. This conductive layer 106 serves as a lower electrode of the capacitor to be formed in the trench 104.

Figure 1B:
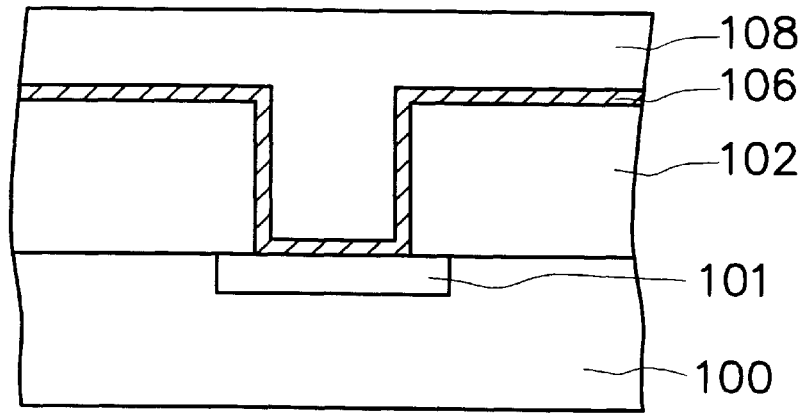

As shown in FIG. 1B, photoresist material having a good gap-filling capability is deposited over the conductive layer 106 to form a photoresist layer 108. The opening 104 is thus filled by the photoresist layer 108.

Figure 1C:
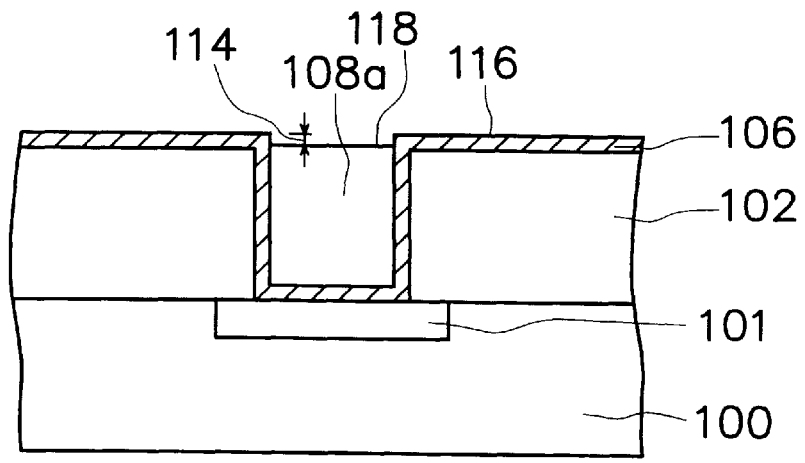
Figure 1D:
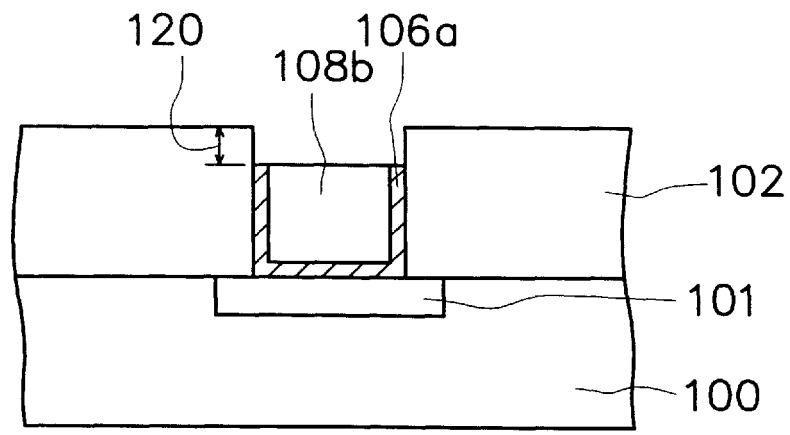
Figure 1E:
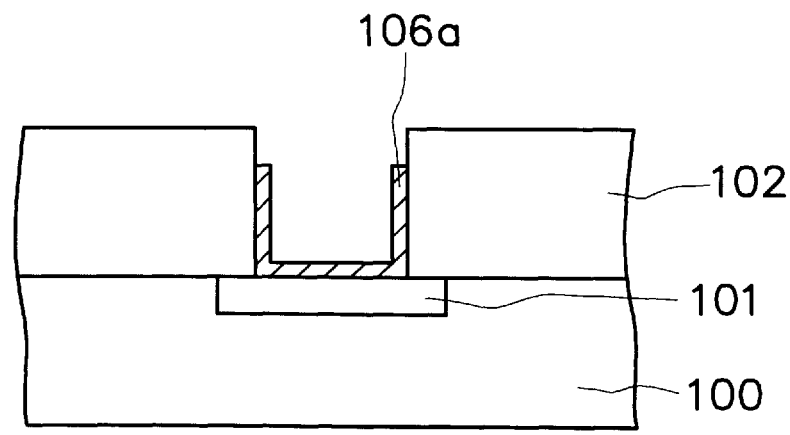

A three-stage of etching operation is carried out to pattern the conductive layer 106. In the first stage, a portion of the photoresist layer 108 is etched away until exposing the conductive layer 106. In the second stage, the exposed conductive layer 106 is etched to expose the top surface of the insulation layer 102, so that the conductive layer 106a remains only in the trench 104 to achieve an electric isolation between capacitors formed in different trenches. In the third and last stage, any residual photoresist material inside the trench 104 is removed. FIGS. 1C to 1E illustrate the aforementioned three-stage of etching operation.

The first stage of etching step is performed as shown in FIG. 1C. A dry etching method is used to etch back the photoresist layer 108, thereby converting the photoresist layer 108 into 108a while exposing the conductive layer 106. The photoresist layer 108a serves to protect the conductive layer 106 inside the trench 104. To ensure complete exposure of the conductive layer 106 outside the trench region 104, the etching step is continued until a top surface 118 of the photoresist layer 108a inside the trench 104 is at a distance 114 lower than a top surface 116 of the conductive layer 106. That is, the photoresist layer 108a has a top surface level lower than a top surface level of the conductive layer 106 with a distance 114. Typically, this distance 114 is smaller than about 1500 Å. The etching operation can be carried out using an etchant that contains gaseous oxygen and halogens. The rate of flow of oxygen over halogens is generally below 10, and preferably, the ratio is between 4 to 8.

In addition, the first stage of etching step can be subdivided into two separate etching steps, including a rapid etching step of the photoresist layer followed by a slow etching step, so that less time is consumed. In the rapid etching operation, an etchant containing oxygen is used to etch away substantially most of the photoresist layer 108 outside the trench region 104. However, the conductive layer 106 is still not exposed yet. A slow etching step is carried out, meanwhile halogen gases are added into the oxygen-containing etchant so that the etching rate of the photoresist layer 108 slows down while the etching rate of the conductive layer 106 increases. The slow etching step is stopped when the top surface 118 of the photoresist layer 108a is at a distance 112 lower than the top surface 116 of the conductive layer 106. Since the addition of halogen gases into the etchant decreases the etching rate of the photoresist layer 108 but increases the etching rate of the conductive layer 106, the formation of a cavity inside the trench due to the over-etching of the photoresist layer 108a can be prevented. Therefore, the photoresist layer 108a is able to protect the conductive layer 106 inside the trench 104.

In the aforementioned etching step, the halogens can be a gaseous compound containing fluorine (F), chlorine (Cl), bromine (Br) or iodine (I). These gaseous compounds include, for example, fluorocarbon, trifluoronitride ($NF_3$), hexafluorosulfide ($SF_6$), chlorine ($Cl_2$), hydrogen chloride (HCl), silicon tetrachloride ($SiCl_4$) or other substances having similar properties. The fluorocarbons, for example, can be carbon tetrafluoride ($CF_4$), trifluoromethane ($CHF_3$), difluoromethane ($CH_2F_2$), fluoromethane ($CH_3F$).

The second stage of etching step is carried out as shown in FIG. 1D. An isotropic dry etching operation is carried out to remove the conductive layer 106 covering a top surface of the insulation layer 102. Etchant used in the step has a high etching selectivity between the conductive layer 106 and the photoresist layer 108a. Hence, only a little of the photoresist layer 108a is removed to result in a photoresist layer 108b. For example, the etchant contains gaseous oxygen and halogens, and the flow rate of oxygen over the flow rate of the halogens is preferably under 2. Under such conditions, etching selectivity between the conductive layer 106 and the photoresist layer 108a can go up to almost 10. The same types of halogen gases as mentioned before are used.

To ensure no electrical connection between two neighboring capacitors, the conductive layer 106 is usually over-etched a little so that a portion of the conductive layer 106 inside the trench 104 is also removed. Ultimately, the upper edge of the conductive layer 106 in the trench is at a distance 120 of between 1500 Å to 2000 Å lower than the top surface of the insulation layer 102. Moreover, a portion of the photoresist layer 108a will also be removed after the isotropic dry etching operation.

In addition to prevention of electrical connection between neighboring capacitors, the isotropic dry etching step of this invention is also able to planarize the top surface of the conductive layer 106. Therefore, a smaller leakage current can be resulted in the subsequently formed capacitor and the average height level of the capacitor can be more easily controlled.

The third stage of etching step is carried out as shown in FIG. 1E. The photoresist layer 108b is removed to expose the conductive layer 106a. The photoresist layer 106b can be removed in an etching step using an etchant that contains oxygen or an etchant that contains oxygen and some gaseous halogens.

The three-stage of etching steps as shown in FIGS. 1C to 1E can be carried out inside the same etching chamber because each etching step is achieved by varying the flow rates between the oxygen and the halogen ratio. Therefore, processing procedure is simplified and the production cost is reduced. Furthermore, the third stage of etching step for removing the photoresist layer 108b can be performed in-situ or ex-situ.

Figure 1F:
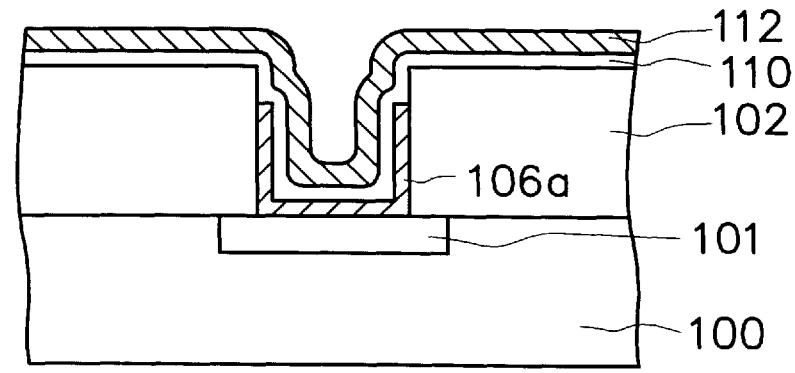

As shown in FIG. 1F, a dielectric layer 110 is formed over the exposed conductive layer 106a. The dielectric layer 110 extends both ways to cover the insulation layer 102. Another conductive layer 112 that serves as the upper electrode of the capacitor is formed over the dielectric layer 110.

In summary, the advantages of the invention includes:

1. A first etching step is performed to remove a portion of the photoresist layer so that the conductive layer outside the trench region is exposed. A second etching step is performed to remove a portion of the conductive layer so that electrical connection between neighboring capacitors is prevented. A third etching operation is further performed to remove any residual photoresist layer. These three etching steps can all be performed inside the same etching chamber, and hence the fabrication process an be simplified and cost can be saved.

2. The isotropic dry etching used in the three stage etchintg process is to remove a portion of the lower electrode conductive layer. In addition to the prevention of electrical connection between neighboring capacitors, a smooth surface is also formed. Hence, the subsequently formed capacitor will have a minimized leakage current and a more standard height.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing dynamic random access memory (DRAM) capacitor, comprising the steps of:

providing a substrate having a conductive region and an insulation layer thereon;

forming a trench in the insulation layer to expose at least a part of the conductive region;

forming a first conductive layer conformal to a surface profile of the insulation and the trench;

forming a photoresist layer over the first conductive layer to completely fill the trench;

removing a portion of the photoresist layer outside the trench region so that a top surface of the first conductive layer is exposed;

performing an isotropic dry etching step, wherein the exposed first conductive layer is removed faster than the photoresist layer, and consequently a top surface of the insulation layer is at a distance higher than a top edge of the first conductive layer inside the trench;

removing the remaining photoresist layer to expose the remaining first conductive layer inside the trench; and forming a dielectric layer and a second conductive layer over the first conductive layer.

2. The method of claim 1, wherein the step of forming the first conductive layer includes depositing polysilicon.

3. The method of claim 1, wherein the step of removing a portion of the photoresist layer to expose a portion of the first conductive layer includes the substeps of performing a rapid etching step followed by a slow etching operation.

4. The method of claim 3, wherein the step of performing the rapid etching step includes using an etchant containing oxygen while the step of performing the slow etching step includes using an etchant containing oxygen and halogen gases.

5. The method of claim 4, wherein the halogen containing gases includes fluorocarbon, trifluoronitride, hexafluorosulfide, chlorine, hydrogen chloride or silicon chloride.

6. The method of claim 5, wherein the fluorocarbon includes carbon tetrafluoride, trifluoromethane, dichloromethane and fluoromethane.

7. The method of claim 4, wherein the flow rates of oxygen over halogens in the slow etching step is smaller than 10.

8. The method of claim 7, wherein the flow rate of oxygen over halogens is preferably between 4 to 8.

9. The method of claim 1, wherein the step of performing isotropic dry etching step to remove the first conductive layer includes using an etchant with oxygen and halogens such that the flow rate between oxygen and halogens is preferably smaller than 2.

10. The method of claim 9, wherein the halogen gases includes fluorocarbon, trifluoronitride, hexafluorosulfide, chlorine, hydrogen chloride or silicon chloride.

11. The method of claim 10, wherein the fluorocarbon includes carbon tetrafluoride, trifluoromethane, dichloromethane and fluoromethane.

12. The method of claim 1, wherein the step of removing the remaining photoresist layer to expose the remaining first conductive layer inside the trench includes performing an etching operation.

13. A method of manufacturing the lower electrode of a dynamic random access memory (DRAM) capacitor, comprising the steps of:

providing a substrate having a conductive region and an insulation layer thereon;

forming a trench in the insulation layer to expose at least of the conductive region;

forming a first conductive layer conformal to surface profiles the insulation layer and the trench;

forming a photoresist layer over the first conductive layer to completely fill the trench;

performing a first stage of etching step on the photoresist layer to expose the first conductive layer;

performing a second stage of etching step using an isotropic dry etching operation, wherein the exposed first conductive layer is removed faster than the photoresist layer, and so that the insulation layer is at a distance higher than a top edge of the first conductive layer inside the trench; and performing a third stage of etching step to remove the remaining photoresist layer to expose the remaining first conductive layer inside the trench.

14. The method of claim 13, wherein the step of forming the first conductive layer includes deposition polysilicon.

15. The method of claim 13, wherein the first stage, the second stage and the third stage of etching steps are conducted inside the same etching station.

16. The method of claim 13, wherein the first stage of etching step further comprises the substeps of performing a rapid etching step followed by a slow etching step.

17. The method of claim 16, wherein the step of performing the rapid etching step includes using an etchant containing oxygen while the slow etching step includes using an etchant containing oxygen and halogen gases.

18. The method of claim 17, wherein the flow rates of oxygen over halogens in the slow etching step is smaller than 10.

19. The method of claim 18, wherein the flow rate of oxygen over halogens is preferably between 4 to 8.

20. The method of claim 13, wherein the second stage of etching step includes using an etchant with oxygen an halogens such that the flow rate between oxygen and halogens is preferably smaller than 2.

* * * * *